(12) United States Patent
Kräuter et al.

(10) Patent No.: US 9,029,907 B2
(45) Date of Patent: May 12, 2015

(54) OPTOELECTRONIC SEMICONDUCTOR COMPONENT

(75) Inventors: Gertrud Kräuter, Regensburg (DE); Bernd Barchmann, Regensburg (DE); Krister Bergenek, Regensburg (DE); Michael Zitzlsperger, Regensburg (DE); Johann Ramchen, Altdorf (DE)

(73) Assignee: Osram Opto Semiconductor GmbH, Regensburg (DE)

( * ) Notice: Subject to any disclaimer, the term of this patent is extended or adjusted under 35 U.S.C. 154(b) by 196 days.

(21) Appl. No.: 13/515,256

(22) PCT Filed: Nov. 17, 2010

(86) PCT No.: PCT/EP2010/067707
§ 371 (c)(1),
(2), (4) Date: Aug. 15, 2012

(87) PCT Pub. No.: WO2011/069791
PCT Pub. Date: Jun. 16, 2011

(65) Prior Publication Data
US 2012/0299041 A1    Nov. 29, 2012

(30) Foreign Application Priority Data
Dec. 11, 2009  (DE) .......................... 10 2009 058 006

(51) Int. Cl.
*H01L 33/60* (2010.01)
*H01L 33/56* (2010.01)
(Continued)

(52) U.S. Cl.
CPC ........ *H01L 33/56* (2013.01); *H01L 31/035281* (2013.01); *H01L 33/505* (2013.01)

(58) Field of Classification Search
CPC ....... H01L 33/505; H01L 33/58; H01L 33/44; H01L 33/54; H01L 33/56; H01L 31/5022; H01L 31/035281; G02B 5/0808
USPC ................... 257/88, E33.057, E33.072, 100; 438/26; 359/604; 136/247; 345/107
See application file for complete search history.

(56) References Cited

U.S. PATENT DOCUMENTS

| | | | |
|---|---|---|---|
| 2009/0166657 | A1 | 7/2009 | Yamada et al. |
| 2010/0320479 | A1 | 12/2010 | Minato et al. |
| 2011/0210357 | A1 | 9/2011 | Kaiser et al. |

FOREIGN PATENT DOCUMENTS

| | | | |
|---|---|---|---|
| DE | 10 2008 025 923 A1 | | 12/2009 |
| EP | 2 216 834 A1 | | 8/2010 |
| EP | 2216834 A1 | * | 8/2010 |

(Continued)

*Primary Examiner* — Kenneth Parker
*Assistant Examiner* — Bo Fan
(74) *Attorney, Agent, or Firm* — Slater & Matsil, L.L.P.

(57) ABSTRACT

An optoelectronic semiconductor component includes a radiation emitting semiconductor chip having a radiation coupling out area. Electromagnetic radiation generated in the semiconductor chip leaves the semiconductor chip via the radiation coupling out area. A converter element is disposed downstream of the semiconductor chip at its radiation coupling out area. The converter element is configured to convert electromagnetic radiation emitted by the semiconductor chip. The converter element has a first surface facing away from the radiation coupling out area. A reflective encapsulation encapsulates the semiconductor chip and portions of the converter element at side areas in a form-fitting manner. The first surface of the converter element is free of the reflective encapsulation.

17 Claims, 2 Drawing Sheets

(51) Int. Cl.
*H01L 31/0352* (2006.01)
*H01L 33/50* (2010.01)

(56) References Cited

FOREIGN PATENT DOCUMENTS

| | | | |
|---|---|---|---|
| JP | 2002151743 A | 5/2002 |
| JP | 2006173271 A | 6/2006 |
| JP | 2006294925 A | 10/2006 |
| JP | 2006352085 A | 12/2006 |
| JP | 2007019096 A | * | 1/2007 |
| JP | 2009218274 A | | 9/2009 |
| TW | M357028 U | | 5/2009 |
| TW | 200947755 A | | 11/2009 |
| WO | WO 2009/048704 A2 | | 4/2009 |
| WO | WO 2009/069671 A1 | | 6/2009 |
| WO | WO 2009069671 A1 | * | 6/2009 |
| WO | WO 2009/115998 A2 | | 9/2009 |
| WO | 2009146689 A1 | | 12/2009 |
| WO | WO 2009/143802 A1 | | 12/2009 |
| WO | 2010035206 A1 | | 4/2010 |

* cited by examiner

OPTOELECTRONIC SEMICONDUCTOR COMPONENT

This patent application is a national phase filing under section 371 of PCT/EP2010/067707, filed Nov. 17, 2010, which claims the priority of German patent application 10 2009 058 006.9, filed Dec. 11, 2009, each of which is incorporated herein by reference in its entirety.

In one aspect, the present invention specifies an optoelectronic semiconductor component in which radiation losses are particularly low and whose radiation exit area appears particularly bright.

In accordance with at least one embodiment of the optoelectronic semiconductor component, the component comprises at least one radiation-emitting semiconductor chip having a radiation coupling-out area. At least part of the electromagnetic radiation generated in the semiconductor chip leaves the semiconductor chip through the radiation coupling-out area. The radiation-emitting semiconductor chip can be a luminescence diode chip, for example. The luminescence diode chip can be a light-emitting or laser diode chip that emits radiation in the range of ultraviolet to infrared light. Preferably, the luminescence diode chip emits light in the visible or ultraviolet range of the spectrum of the electromagnetic radiation.

In accordance with at least one embodiment of the semiconductor component, the component comprises at least one converter element which is disposed downstream of the semiconductor chip at its radiation coupling-out area for the conversion of electromagnetic radiation emitted by the semiconductor chip. The at least one converter element has a first surface facing away from the radiation coupling-out area. Furthermore, the at least one converter element is disposed downstream of the semiconductor chip in such a way that at least part of the electromagnetic radiation generated during the operation of the semiconductor chip passes into the converter element. By way of example, the converter element converts electromagnetic radiation emitted by the semiconductor chip into radiation having a greater wavelength. By way of example, the at least one converter element is applied to the radiation coupling-out area of the at least one semiconductor chip and can be connected thereto by means of a connecting means.

In accordance with at least one embodiment, the optoelectronic semiconductor component comprises a reflective encapsulation. In this context, "reflective" means that the encapsulation is reflective to at least 80%, preferably more than 90%, of electromagnetic radiation impinging on it from the semiconductor chip and/or the converter element. The reflective encapsulation can be a layer applied to outer areas of the semiconductor chip and of the converter element. It is likewise conceivable for the encapsulation to be a potting applied, for example, by the semiconductor chip and the converter element being potted.

In accordance with at least one embodiment, the reflective encapsulation encapsulates the semiconductor chip and at least in places the converter element at side areas in a form-fitting manner. By way of example, the side areas of the semiconductor chip and of the converter element run in a vertical direction, that is to say perpendicularly or transversely with respect to an epitaxially grown semiconductor layer sequence of the radiation-emitting semiconductor chip. In this context, "encapsulates in a form-fitting manner" means that the reflective encapsulation surrounds the semiconductor chip and in places the converter element at the side areas and is in direct contact with them. In other words, preferably neither a gap nor an interruption forms between the reflective encapsulation and the side areas. In this case, "at least in places" can mean that the reflective encapsulation, for example a potting, encapsulates the side areas of the converter element in a form-fitting manner only up to a certain filling height. As a result, it is possible for the semiconductor chip itself to be completely covered at its side areas by the reflective encapsulation, the converter element still projecting from the reflective encapsulation. Therefore, the side areas of the converter element are covered by the reflective encapsulation completely or partly up to a predeterminable height.

In accordance with at least one embodiment, the first surface of the converter element is free of the encapsulation. "Free" means that the first surface is not covered by the reflective encapsulation nor is the reflective encapsulation disposed downstream of the converter element along the radiation exit path of the semiconductor component. The radiation can therefore emerge from the converter element without being impeded. It is at most possible for material residues of the reflective encapsulation still to be situated on the first surface in a manner governed by production, said material residues covering at most 10%, preferably at most 5%, of the first surface, however.

In accordance with at least one embodiment of the optoelectronic semiconductor component, the latter comprises at least one radiation-emitting semiconductor chip having a radiation coupling-out area, through which at least part of the electromagnetic radiation generated in the semiconductor chip leaves the semiconductor chip. Furthermore, a converter element is disposed downstream of the semiconductor chip at its radiation coupling-out area for the conversion of electromagnetic radiation emitted by the semiconductor chip. The converter element has a surface facing away from the radiation coupling-out area. Furthermore, the optoelectronic semiconductor component comprises a reflective encapsulation, wherein the reflective encapsulation encapsulates the semiconductor chip and at least in places the converter element at side areas in a form-fitting manner, and the first surface of the converter element is free of the reflective encapsulation.

The optoelectronic semiconductor component described here is in this case based on the insight, inter alia, that emergence of the electromagnetic radiation primarily generated in the semiconductor component via side areas of a semiconductor chip and side areas of a converter element disposed downstream of the semiconductor chip leads to radiation losses. Losses in a radiation efficiency of the semiconductor component can occur, since the laterally emerging electromagnetic radiation usually cannot be made usable for physical and/or technical applications. In other words, this can lead to a reduction of the radiation efficiency. In this context, "radiation efficiency" means the ratio between the useable luminous energy respectively coupled out from the semiconductor component and the luminous energy primarily generated within the semiconductor chip.

In order, then, to avoid such undesirable radiation losses and at the same time to increase the radiation efficiency, the optoelectronic semiconductor component described here makes use of the concept, inter alia, of providing a reflective encapsulation which encapsulates the semiconductor chip and at least in places the converter element of the semiconductor component at side areas in a form-fitting manner, wherein a first surface of the converter element is free of the reflective encapsulation.

By means of the reflective encapsulation, the electromagnetic radiation which is generated within the semiconductor chip and which emerges in part through side areas of the semiconductor chip is reflected back into the semiconductor chip and, for example, in the direction of the converter element. Advantageously, as large a proportion as possible of the radiation generated in the semiconductor chip is thus guided in the direction of the converter element.

At least part of the radiation coupled out from the semiconductor chip via a radiation coupling-out area from the semiconductor chip and subsequently coupled into the converter element is then firstly radiation-converted direction-independently within the converter element, for example by radiation-converting particles contained in the converter element, and is then re-emitted thereby. "Direction-independently" means that the electromagnetic radiation converted in the converter element is re-emitted within the converter element by the radiation-converting particles in no preferred direction.

After the conversion of the electromagnetic radiation within the converter element, part of the converted radiation is re-emitted in the direction of side areas of the converter element and then emerges from the converter element via the side areas of the converter element. This proportion of radiation subsequently at least partly impinges on the reflective encapsulation and is partly reflected back from the latter into the converter element. At least part of this radiation reflected back into the converter element is guided in a direction away from the semiconductor chip and can then be coupled out from the converter element and thus also from the semiconductor component. If part of the radiation reflected back into the converter element is reflected back, for example in the direction of the semiconductor chip, the reflection process can be repeated a number of times. It is conceivable for the reflection process to be repeated until the corresponding proportion of radiation couples out from the converter element. In other words, the useable radiation coupled out from the semiconductor component is composed of the direct proportion of radiation, that is to say the proportion of radiation which is coupled out from the semiconductor component without prior reflection at the reflective encapsulation, and the proportion of radiation which leaves the semiconductor component as a result of (back) reflection at least once at the encapsulation, and is coupled out from the semiconductor component through the first surface.

Therefore, as great a proportion as possible of the generated radiation of the semiconductor chip is guided in the direction of the converter element and coupled out from the semiconductor component via a first surface of the converter element. Advantageously, by means of the encapsulation described here, both the radiation efficiency of the semiconductor component and a luminance at the first surface are increased, as a result of which the first surface of the converter element appears considerably brighter, for example, to an external observer. In this case, "luminance" denotes the luminous energy coupled out from the first surface in a ratio relative to the area of the first surface.

In accordance with at least one embodiment, the radiation-emitting semiconductor chip emits light in the blue to ultraviolet range of the spectrum of the electromagnetic radiation.

In accordance with at least one embodiment, the reflective encapsulation is formed with a silicone or a mixture of a silicone or an epoxide, into which radiation-reflecting particles are introduced, wherein the radiation-reflecting particles at least consist of $ZrO_2$ or at least contain $ZrO_2$. If the radiation-emitting semiconductor chip emits blue or ultraviolet light, $ZrO_2$ has particularly low absorption properties in such a wavelength range. In other words, a high proportion of electromagnetic radiation is reflected by the reflective encapsulation in this case.

In accordance with at least one embodiment, the reflective encapsulation is a potting, the extent of which in a direction perpendicular to the side areas is different at least in places along the side areas. In other words, in this case the reflective encapsulation does not have a uniform thickness along the side areas. It has been recognized that in such an embodiment of the reflective encapsulation, the latter reflects as great a proportion as possible of electromagnetic radiation impinging on it.

In accordance with at least one embodiment, the encapsulation does not project beyond the converter element laterally. It is conceivable for the encapsulation to terminate flush with the first surface of the converter element in a lateral direction. The reflective encapsulation then encapsulates the side areas of the converter element completely, for example, as a result of which the proportion of radiation reflected back into the converter element from the reflective encapsulation is as great as possible. The electromagnetic radiation generated in the semiconductor chip can therefore leave the semiconductor component, apart from possible absorption effects of the encapsulation, only at the locations provided for this purpose, that is to say exclusively through the first surface and thus through the converter element. Therefore, the reflective encapsulation contributes to a particularly effective conversion of the radiation emitted by the semiconductor chip.

Furthermore, it is conceivable in this context for an optical element, for example a lens, which laterally projects beyond the semiconductor chip in its maximum lateral extent, to be applied to the first surface of the converter element.

In accordance with at least one embodiment, the converter element is formed with a ceramic material. The converter element can then comprise a luminescence conversion material embedded into a matrix material, for example a glass ceramic or a ceramic. By way of example, the converter element is then a lamina. It is likewise possible for the converter element to completely consist of a ceramic luminescence conversion material. The converter element can then be a lamina composed of such a ceramic luminescence conversion material.

In accordance with at least one embodiment of the semiconductor component, the converter element has a thickness in a vertical direction which is at least double the magnitude of the thickness in a vertical direction of the semiconductor chip. Advantageously, the area proportion of the total surface area content of the converter element which is made up by the side areas of the converter element thus becomes as great as possible. As a result, the proportion of radiation reflected back into the converter element by the reflective encapsulation is increased, as a result of which the radiation efficiency and the luminance of the semiconductor component are significantly increased further.

In accordance with at least one embodiment, the converter element has a thickness in a vertical direction of at least 50 μm to at most 500 μm. Preferably, the converter element has a thickness in a vertical direction of at least 50 to at most 150 μm. Such a thickness range of the converter element has proved to be especially advantageous with regard to the reduction of radiation losses.

In accordance with at least one embodiment, at least 10% of the electromagnetic radiation emerging from the converter element emerges at the side areas of the converter element and is reflected by the reflective encapsulation. If, by way of example, the area content of the side areas of the converter element in relation to the total surface area content of the converter element amounts to 30%, then up to 30% of the electromagnetic radiation emitted by the semiconductor chip can emerge from the converter element and be reflected back by the reflective encapsulation, for example into the converter element.

In accordance with at least one embodiment, the first surface of the converter element is structured at least in places. In this context, "structured" means that elevations and depressions are situated on the first surface at least in places. The surface structured at least in places can be formed, for example, with prefabricated, regular structures introduced into the first surface in a controlled manner. The structures can be embodied in relief- or trench-like fashion. By way of example, the first surface is structured in pyramidal fashion. That is to say that the first surface has a multiplicity of elevations embodied in pyramid-like fashion. It is likewise conceivable for the first surface to be structured by at least two different structuring profiles alternating periodically along the first surface. By way of example, one structuring profile can be pyramid-like elevations and the other structuring profile can be cylindrical elevations or a random roughening. It can be shown that such structured surfaces increase a radiation efficiency of the semiconductor component.

In accordance with at least one embodiment of the semiconductor component, a radiation-transmissive adhesion layer is arranged between the semiconductor chip and the converter element. The refractive index can be, for example, between the refractive index of the material of the semiconductor chip that directly adjoins the adhesion layer and the refractive index of the converter element. "Radiation-transmissive" means that the adhesion layer is transmissive to electromagnetic radiation at least to the extent of 80%, preferably to the extent of at least 90%.

By way of example, the adhesion layer is applied to the radiation coupling-out area of the semiconductor chip and is in direct contact with the radiation coupling-out area and, after application of the converter element to the adhesion layer, also with a surface lying opposite the first surface of the converter element. In other words, the adhesion layer then spaces apart the semiconductor chip and the converter element from one another. The adhesion layer avoids detachment (also delamination) of the converter element from the semiconductor chip. The semiconductor chip and the converter element are therefore mechanically fixedly connected to one another via the adhesion layer.

Electromagnetic radiation primarily generated in the semiconductor chip can pass from the semiconductor chip through the radiation coupling-out area through the adhesion layer and couple into the converter element. The refractive index range provided for the adhesion layer advantageously affords the possibility of avoiding disturbing backreflections into the semiconductor chip, as a result of which as much radiation as possible is coupled into the converter element. It is likewise possible for the refractive index of the radiation-transmissive adhesion layer to be less than the refractive index of the material of the semiconductor chip that directly adjoins the adhesion layer.

In this context, it is conceivable for the refractive index of the radiation-transmissive adhesion layer additionally to be less than the refractive index of the converter element. By way of example, the refractive index of the radiation-transmissive adhesion layer is in a range of 1.3 to 1.7, preferably in a range of 1.4 to 1.56. By way of example, the adhesion layer is then formed with a silicone, an epoxide or with a mixture of the two materials. The materials mentioned exhibit particularly good adhesion properties both to the material of the semiconductor chip and to the material of the converter element.

In accordance with at least one embodiment the reflective encapsulation completely covers the side areas of the semiconductor chip and side areas of the adhesion layer. Advantageously, as great a proportion as possible of the electromagnetic radiation generated in the semiconductor chip which emerges via side areas of the semiconductor chip and via the side areas of the adhesion layer is thus reflected back by the reflective encapsulation into the semiconductor chip and into the adhesion layer, for example in the direction of the converter element.

In accordance with at least one embodiment, the semiconductor chip is fixed by its area lying opposite the converter element on a carrier. The carrier can be a carrier substrate that is different than a growth substrate.

In accordance with at least one embodiment, the carrier is arranged by its area lying opposite the semiconductor chip on a component carrier. The component carrier can be formed with a plastic, a ceramic or a metal. The component carrier is embodied as a printed circuit board or, if the component carrier is metallic, as a carrier frame (leadframe).

In accordance with at least one embodiment, the reflective encapsulation is applied by means of a jet process. It is likewise conceivable for the reflective encapsulation to be applied by means of a molding process, selective deposition (for example plasma spray process), screen printing, sputtering or spraying.

In accordance with at least one embodiment, the reflective encapsulation is formed with a silicone or a mixture of a silicone or an epoxide, into which radiation-reflecting particles are introduced, wherein the radiation-reflecting particles at least consist of one of the materials $TiO_2$, $BaSO_4$, $ZnO$, $Al_xO_y$, $ZrO_2$ or contain one of the materials mentioned.

In accordance with at least one embodiment, an extent of the reflective encapsulation in a direction perpendicular to the side areas is greater than 1000 μm. By way of example, the direction perpendicular to the side areas is the lateral direction.

The features according to which the reflective encapsulation is applied by means of a jet process, a molding process, selective deposition, screen printing, sputtering or spraying are in each case features related to the optoelectronic semiconductor component since the methods of application can be demonstrated directly in the optoelectronic semiconductor component.

BRIEF DESCRIPTION OF THE DRAWINGS

The semiconductor component described here is explained in greater detail below on the basis of an exemplary embodiment and the associated figure.

In the exemplary embodiment and the figure, identical or identically acting constituent parts are in each case provided with the same reference symbols. The elements illustrated should not be regarded as true to scale, rather, individual elements may be illustrated with an exaggerated size in order to afford a better understanding.

DETAILED DESCRIPTION OF ILLUSTRATIVE EMBODIMENTS

Figure 1:
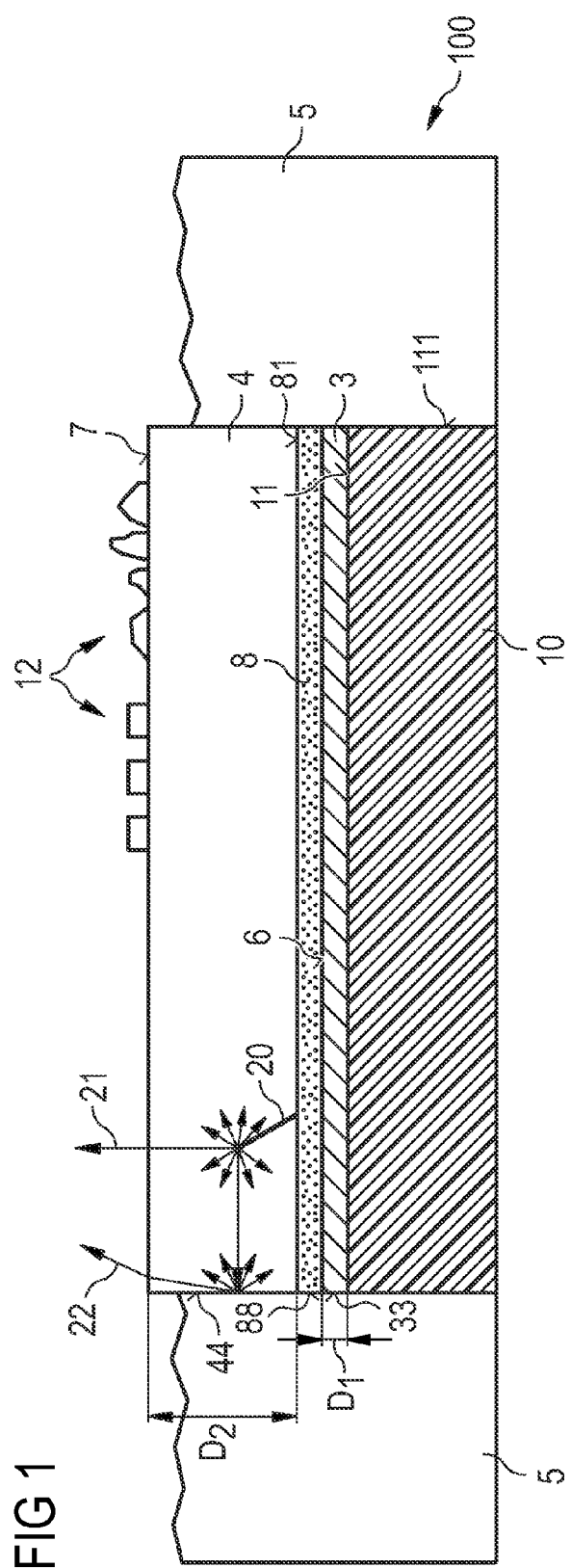
FIG. 1 shows, in a schematic sectional illustration, an exemplary embodiment of an optoelectronic semiconductor component described here.

In FIG. 1, on the basis of a schematic sectional illustration, an optoelectronic semiconductor component 100 described here comprising a carrier 10, an optoelectronic semiconductor chip 3, which is fixed onto an area 11 of the carrier 10, an adhesion layer 8 and a converter element 4, in accordance with the exemplary embodiment of the semiconductor component 100 described here, is elucidated in greater detail. In the exemplary embodiment, the semiconductor chip 3 is a thin-film light-emitting diode chip, wherein the carrier 10 is a carrier substrate that is different than a growth substrate. By way of example, the carrier 10 is formed with germanium or silicon. The semiconductor chip 3 then comprises, for example, an epitaxially grown semiconductor layer sequence that is detached from the growth substrate.

The adhesion layer 8 is applied on a radiation coupling-out area 6 of the semiconductor chip 3. The converter element 4 is applied on an area 81 of the adhesion layer 8 that lies opposite the semiconductor chip 3. The converter element is formed with a ceramic material, into which, by way of example, radiation-converting materials, for example particles and/or fibers, are introduced. The converter element 4 has a thickness $D_2$ of 200 µm, the thickness $D_1$ of the semiconductor chip 3 being 100 µm.

In the present exemplary embodiment, the adhesion layer 8 and the converter element 4 are in direct contact, such that neither a gap nor an interruption forms between the converter element 4 and the adhesion layer 8. In order to avoid detachment of the converter element 4 from the semiconductor chip 3, the adhesion layer 8 enables the converter element 4 and the semiconductor chip 3 to be mechanically fixedly connected to one another via the adhesion layer 8. The adhesion layer 8 is formed with a silicone.

A reflective encapsulation 5 covers side areas 33 of the semiconductor chip 3, side areas 88 of the adhesion layer 8 and side areas 111 of the carrier 10 completely and in places side areas 44 of the converter element 4.

In the present case, the reflective encapsulation 5 is embodied as a potting. It can be discerned that, to an external observer, the semiconductor chip 3 is completely covered by the reflective encapsulation 5, the converter element 4 still projecting from the reflective encapsulation. An extent of the reflective encapsulation in a direction perpendicular to the side areas, for example in a lateral direction, can be, in particular, greater than 1000 µm.

The reflective encapsulation 5 can be formed with a silicone, into which radiation-reflecting materials, for example particles and/or fibers, are introduced. A reflective encapsulation 5 formed with such a material is especially stable with respect to ageing. By way of example, silicones have the advantage of ageing to a significantly lesser extent than other encapsulation compositions, for example resins, upon exposure to incident electromagnetic radiation. Furthermore, silicones have a considerably increased thermal stability compared with epoxides, for example. While epoxides can typically be heated up to a maximum of approximately 150° C., without incurring damage, this is possible up to approximately 200° C. in the case of silicones. It is likewise conceivable for the reflective encapsulation 5 to be formed with a hybrid material, for example a mixture of a silicone and an epoxide.

By way of example, the radiation-reflecting particles are particles which consist of at least one of the materials $TiO_2$, $BaSO_4$, $ZnO$, $Al_xO_y$, $ZrO_2$ or contain one of the materials mentioned. If the optoelectronic semiconductor chip 3 emits blue light and/or electromagnetic radiation in the ultraviolet spectral range of the spectrum of electromagnetic radiation, $ZrO_2$, in particular, can be used as material for the radiation-reflecting particles since $ZrO_2$ has particularly low absorption properties in such a wavelength range. In other words, a high proportion of electromagnetic radiation is reflected by the reflective encapsulation 5 in this case.

Preferably, the concentration of the radiation-scattering particles in the reflective encapsulation 5 is 10 to 40% by weight. Preferably, the concentration is 15 to 30% by weight. By way of example, the reflectivity of the reflective encapsulation 5 can be set individually in a manner dependent on the concentration of the radiation-scattering particles. To an external observer, the reflective encapsulation 5 appears in a white hue on account of the reflection properties since preferably the entire impinging color spectrum is reflected by the reflective encapsulation. The white hue of the encapsulation can reduce the color contrast between the electromagnetic radiation coupled out from a first surface 7 of the converter element 4 and the reflective encapsulation 5, such that the entire semiconductor component 100 appears, to an external observer, in a hue that is as uniform as possible over its entire lateral extent.

The radiation 20 coupled into the converter element 4 is at least partly converted in the converter element 4 and then re-emitted direction independently within the converter element 4. In the exemplary embodiment, 30% of the electromagnetic radiation emerging from the converter element 4 emerges from the side areas 44 of the converter element 4. After emerging from the converter element 4, the electromagnetic radiation is partly reflected back by the reflective encapsulation 5 into the converter element 4 in the direction of the first surface 7, that is to say away from the semiconductor chip 3.

The radiation 20 coupled out from the converter element 4 through the first surface 7 is therefore composed of a reflected radiation proportion 22 and a radiation proportion 21 which emerges from the semiconductor component 100 without having been reflected by the reflective encapsulation 5.

Since, in the present exemplary embodiment, the reflective encapsulation 5 likewise completely covers the side areas 111 of the carrier 10, radiation that has already left the optoelectronic semiconductor component 100 is prevented from being reabsorbed again, for example, via the side areas 111 of the carrier 10.

Furthermore, the first surface 7 of the converter element 4 is structured at least in places. In other words, the first surface 7 has coupling-out structures 12 at least in places. The electromagnetic radiation generated by the semiconductor chip 3 is coupled out from the semiconductor component 100 via the first surface 7 structured at least in places. It can be shown that such coupling-out structures 12 significantly increase the radiation efficiency.

That is to say that in the exemplary embodiment shown in FIG. 1 the radiation efficiency increases firstly by virtue of the reflective encapsulation 5 described here and secondly by virtue of the coupling-out structures 12, wherein both effects can advantageously complement each other.

Figure 2:
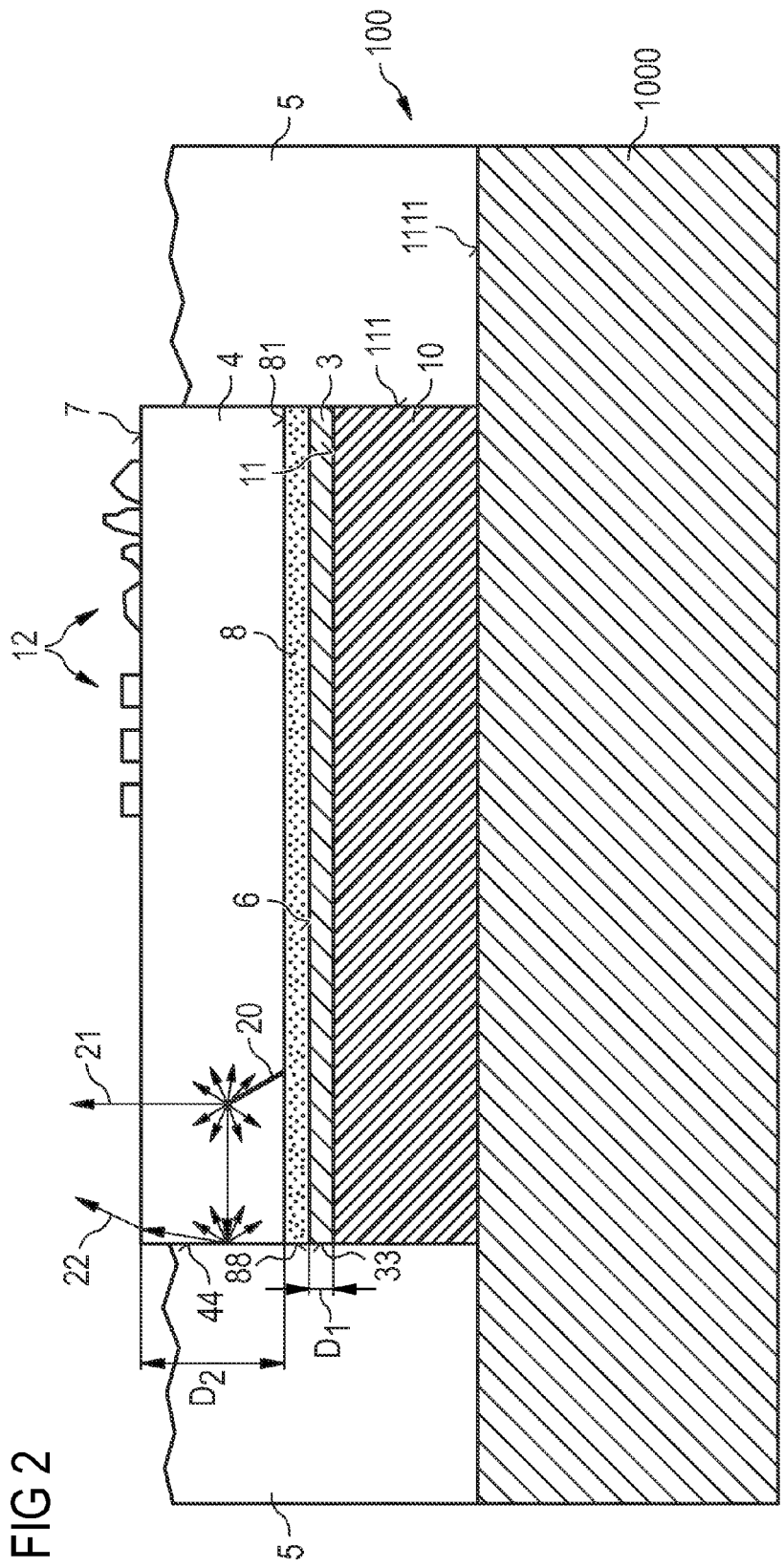
FIG. 2 shows, in a schematic sectional illustration, a further exemplary embodiment of an optoelectronic semiconductor component described here.

In FIG. 2, the carrier 10 is arranged by its area lying opposite the semiconductor chip 3 on a component carrier 1000. In the present case, the component carrier 1000 is a metallic carrier frame, to the surface of which a gold layer is applied at least in places. The reflective encapsulation 5 covers side areas 33 of the semiconductor chip 3, side areas 88 of the adhesion layer 8 and side areas 111 of the carrier 10 completely and in places side areas 44 of the converter element 4. Furthermore, the reflective encapsulation 5 covers at least in places locations of an area 1111 of the component carrier 1000 that are not covered by the carrier 10.

If electromagnetic radiation that has already left the optoelectronic semiconductor component 100 is deflected back in the direction of the component carrier 1000, for example by an optical unit disposed downstream of the optoelectronic semiconductor component 100 in an emission direction of the semiconductor component 100, then as great a proportion of radiation as possible is reflected back again by the reflective encapsulation 5 in a direction away from the component carrier 1000. In other words, the reflectivity of the gold surface of the component carrier 1000 is increased by the reflective encapsulation 5.

An increased reflectivity brought about by the reflective encapsulation 5 is likewise manifested in the case of a component carrier 1000 formed with silver or coated with silver. In addition, the reflective encapsulation 5 affords protection against environmental influences, as a result of which, by way of example, corrosion of the component carrier 1000, for example of the silver, is avoided.

The invention is not restricted by the description on the basis of the exemplary embodiment. Rather, the invention encompasses any novel feature and also the combination of features, which in particular includes any combination of features in the patent claims, even if this feature or this combination itself is not explicitly specified in the patent claims or the exemplary embodiment.

The invention claimed is:

1. An optoelectronic semiconductor component, comprising
    a radiation-emitting semiconductor chip having a radiation coupling-out area, wherein electromagnetic radiation generated in the semiconductor chip leaves the semiconductor chip via the radiation coupling-out area;
    a converter element disposed downstream of the semiconductor chip at its radiation coupling-out area, the converter element configured to convert electromagnetic radiation emitted by the semiconductor chip, wherein the converter element has a first surface facing away from the radiation coupling-out area; and
    a reflective encapsulation, wherein the reflective encapsulation encapsulates the semiconductor chip and portions of the converter element at side areas in a form-fitting manner, wherein the converter element projects from the reflective encapsulation, and wherein the first surface of the converter element and side areas of portions of the converter element projecting outwards are free of the reflective encapsulation, and wherein the reflective encapsulation is applied by a jet process.

2. The optoelectronic semiconductor component according to claim 1, wherein:
    the radiation-emitting semiconductor chip emits light in the blue to ultraviolet range of the spectrum of the electromagnetic radiation;
    the reflective encapsulation is formed with a silicone or a mixture of a silicone or an epoxide, wherein radiation-reflecting particles are introduced into the reflective encapsulation, the radiation-reflecting particles comprising $ZrO_2$; and
    the reflective encapsulation comprises a potting, wherein the extent of the potting in a direction perpendicular to the side areas is different at least in places along the side areas.

3. The optoelectronic semiconductor component according to claim 1, wherein the converter element comprises a ceramic material.

4. The optoelectronic semiconductor component according to claim 1, wherein the converter element has a thickness in a vertical direction which is at least double a thickness in the vertical direction of the semiconductor chip.

5. The optoelectronic semiconductor component according to claim 1, wherein the converter element has a thickness in a vertical direction between 50 μm and 500 μm.

6. The optoelectronic semiconductor component according to claim 1, wherein at least 10% of the electromagnetic radiation emerging from the converter element emerges at the side areas of the converter element and is reflected by the reflective encapsulation.

7. The optoelectronic semiconductor component according to claim 1, wherein the first surface of the converter element is structured at least in places.

8. The optoelectronic semiconductor component according to claim 1, further comprising a radiation-transmissive adhesion layer arranged between the semiconductor chip and the converter element.

9. The optoelectronic semiconductor component according to claim 1, wherein the reflective encapsulation completely covers the side areas of the semiconductor chip and side areas of the adhesion layer.

10. The optoelectronic semiconductor component according to claim 1, wherein the reflective encapsulation is formed with a silicone or a mixture of a silicone or an epoxide, wherein radiation-reflecting particles are introduced into the reflective encapsulation, the radiation-reflecting particles comprising a material selected from the group consisting of $TiO_2$, $BaSO_4$, ZnO, $Al_xO_y$, $ZrO_2$ and combinations thereof.

11. The optoelectronic semiconductor component according to claim 1, wherein an extent of the reflective encapsulation in a direction perpendicular to the side areas is greater than 1000 μm.

12. The optoelectronic semiconductor component according to claim 1, wherein
    the semiconductor chip is fixed on a carrier by an area lying opposite the converter element, the carrier being different than a growth substrate, and
    the carrier is arranged on a component carrier by an area lying opposite the semiconductor chip.

13. The optoelectronic semiconductor component according claim 12, wherein the component carrier is a metallic carrier frame, and wherein a gold layer or a silver layer is applied at least in places to a surface of the component carrier.

14. The optoelectronic semiconductor component according claim 12, wherein the component carrier has an area facing the carrier and wherein the area is not covered by the carrier in places.

15. The optoelectronic semiconductor component according claim 14, further comprising a radiation-transmissive adhesion layer arranged between the semiconductor chip and the converter element, wherein:
    the reflective encapsulation completely covers side areas of the semiconductor chip, side areas of the adhesion layer, and side areas of the carrier;
    the reflective encapsulation covers side areas of the converter element at least in places; and
    the reflective encapsulation covers areas of the component carrier facing the carrier that are not covered by the carrier.

16. An optoelectronic semiconductor component, comprising:
    a radiation-emitting semiconductor chip having a radiation coupling-out area, the radiation-emitting semiconductor chip configured to generate electromagnetic radiation that leaves the semiconductor chip through the radiation coupling-out area;
    a converter element disposed downstream of the semiconductor chip at its radiation coupling-out area, the converter element coupled to convert electromagnetic radiation emitted by the semiconductor chip, wherein the converter element has a first surface facing away from the radiation coupling-out area, wherein the converter element completely consists of a ceramic luminescence conversion material and the first surface of the converter element has a plurality of coupling-outstructures; and a reflective encapsulation, wherein the reflective encapsulation encapsulates the semiconductor chip and, at least in places, the converter element at side areas in a form-fitting manner such that the first surface of the converter element is free of the reflective encapsulation, wherein the reflective encapsulation is a potting that is applied by the semiconductor chip and the converter element being potted, and wherein an extent of the reflective encapsulation in a direction perpendicular to the side areas is greater than 1000 µm.

17. An optoelectronic semiconductor component, comprising:

a radiation-emitting semiconductor chip having a radiation coupling-out area, the radiation-emitting semiconductor chip configured to generate electromagnetic radiation that leaves the semiconductor chip through the radiation coupling-out area;

a converter element disposed downstream of the semiconductor chip at its radiation coupling-out area, the converter element coupled to convert electromagnetic radiation emitted by the semiconductor chip, wherein the converter element has a first surface facing away from the radiation coupling-out area, wherein the converter element completely consists of a ceramic luminescence conversion material and the first surface of the converter element has a plurality of coupling-outstructures; and a reflective encapsulation, wherein the reflective encapsulation encapsulates the semiconductor chip and, at least in places, the converter element at side areas in a form-fitting manner such that the first surface of the converter element is free of the reflective encapsulation, wherein the radiation-emitting semiconductor chip emits light in the blue to ultraviolet range of the spectrum of the electromagnetic radiation;

wherein the reflective encapsulation is formed with a silicone or a mixture of a silicone or an epoxide, into which radiation-reflecting particles are introduced, wherein the radiation-reflecting particles comprise $ZrO_2$; and wherein the reflective encapsulation is a potting, the extent of which in a direction perpendicular to the side areas is different at least in places along the side areas.

* * * * *

UNITED STATES PATENT AND TRADEMARK OFFICE
CERTIFICATE OF CORRECTION

PATENT NO. : 9,029,907 B2  
APPLICATION NO. : 13/515256  
DATED : May 12, 2015  
INVENTOR(S) : Gertrud Krauter Page 1 of 1

It is certified that error appears in the above-identified patent and that said Letters Patent is hereby corrected as shown below:

On the Title Page, Item (73) Assignee, line 1, delete "Osram Opto Semiconductor GmbH," and insert --Osram Opto Semiconductors GmbH,--.

Signed and Sealed this  
First Day of March, 2016

Michelle K. Lee  
*Director of the United States Patent and Trademark Office*